United States Patent
Lin et al.

(10) Patent No.: US 9,553,113 B1
(45) Date of Patent: Jan. 24, 2017

(54) PIXEL UNIT AND PIXEL ARRAY

(71) Applicant: AU Optronics Corporation, Hsin-Chu (TW)

(72) Inventors: Hung-Che Lin, Hsin-Chu (TW); Sheng-Ju Ho, Hsin-Chu (TW); Shang-Jie Wu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/184,373

(22) Filed: Jun. 16, 2016

(30) Foreign Application Priority Data

Nov. 19, 2015 (TW) .............................. 104138359 A

(51) Int. Cl.
  *H01L 27/14* (2006.01)
  *H01L 27/12* (2006.01)
  *H01L 23/50* (2006.01)
  *H01L 21/768* (2006.01)

(52) U.S. Cl.
  CPC ....... *H01L 27/124* (2013.01); *H01L 21/76897* (2013.01); *H01L 23/50* (2013.01); *H01L 27/1259* (2013.01)

(58) Field of Classification Search
  CPC .... H01L 27/124; H01L 23/50; H01L 27/1259; H01L 21/76897; G02F 1/136286; G02F 2001/133388
  See application file for complete search history.

(56) References Cited

U.S. PATENT DOCUMENTS

2008/0303966 A1* 12/2008 Chang ............... G02F 1/134309 349/38
2015/0035167 A1* 2/2015 Wang ............... G02F 1/136286 257/774

FOREIGN PATENT DOCUMENTS

| JP | 2000078291 | | 3/2000 |
|---|---|---|---|
| KR | 10-2014-0006 | * | 1/2014 |
| TW | 200835991 A | | 9/2008 |
| TW | 201215979 A | | 4/2012 |
| TW | I380110 | | 12/2012 |

OTHER PUBLICATIONS

Taiwan Patent Office "Office Action" issued on Jun. 22, 2016, Taiwan.

* cited by examiner

*Primary Examiner* — A. Sefer
(74) *Attorney, Agent, or Firm* — WPAT, PC; Justin King

(57) ABSTRACT

A pixel unit includes a scan line, data lines, first and second pixel structures, first and second common electrode lines, and a common connecting portion. The first pixel structure includes a first switching element, a first main pixel electrode, a first sub pixel electrode, and a first active element. The second pixel structure includes a second switching element, a second main pixel electrode, a second sub pixel electrode, and a second active element. The first main and sub pixel electrodes and the first active element are electrically connected to the first switching element. The second main and sub pixel electrodes and the second active element are electrically connected to the second switching element. The first and second common electrode lines are separated at a position where the scan line passes. The common connecting portion electrically connects the first common electrode line and the second common electrode line.

14 Claims, 5 Drawing Sheets

PIXEL UNIT AND PIXEL ARRAY

BACKGROUND

Technical Field

The present invention relates to a pixel unit and a pixel array, and in particular, to a pixel unit having a common connecting portion.

Related Art

The progress of science and technology has resulted in continuous development of display technology, wherein light, thin, short, and small flat panel displays are replacing conventional thick and heavy cathode ray tube displays. In modern display products, in order to improve screen resolution, pixel units are designed with transistors connected to a common voltage and a common electrode line so as to produce a voltage division effect.

SUMMARY

The present invention provides a pixel unit and a pixel array, which can effectively increase an aperture ratio while avoiding a short circuit or a disconnection problem of a transparent electrode material, so as to improve the yield and quality of displays.

The present invention provides a pixel unit, including a scan line, a first data line, a second data line, a first pixel structure, a second pixel structure, a first common electrode line, a second common electrode line, and a common connecting portion. The first pixel structure includes a first switching element, a first main pixel electrode, a first sub pixel electrode, and a first active element. The second pixel structure includes a second switching element, a second main pixel electrode, a second sub pixel electrode, and a second active element. The first main pixel electrode and the first sub pixel electrode are separately disposed at two sides of the scan line and are electrically connected to the first switching element. The first active element is electrically connected to the first switching element. The second pixel structure includes a second switching element, a second main pixel electrode, a second sub pixel electrode, and a second active element. The second main pixel electrode and the second sub pixel electrode are separately disposed at two sides of the scan line and are electrically connected to the second switching element. The second active element is electrically connected to the second switching element. The first common electrode line is disposed between the first main pixel electrode and the second main pixel electrode, the second common electrode line is disposed between the first sub pixel electrode and the second sub pixel electrode, and the first common electrode line and the second common electrode line are separated at a position where the scan line passes. The common connecting portion electrically connects the first common electrode line and the second common electrode line.

The present invention provides a pixel array, including multiple foregoing pixel units, where the pixel units are repeatedly arranged to form an array; the first pixel structures and the second pixel structures of the pixel units are arranged in a first direction in an interlaced manner to define multiple columns; the first pixel structures and the second pixel structures are arranged in a second direction in an interlaced manner to define multiple rows; and the first direction is different from the second direction.

On the basis of the above, the pixel structure and the pixel array of the present invention increases an aperture ratio by means of an connecting portion. According to another aspect, the design of the pixel structure and the pixel array of the present invention can enable a connecting portion and a pixel electrode to be spaced with a relatively large distance, and therefore, occurrence of a short circuit problem between the bridge electrode and the pixel electrode can be avoided. By using the design of the pixel structure and the pixel array of the present invention, a disconnection of a connecting portion may be also avoided, so as to improve a yield of displays.

In order to make the aforementioned features and advantages of the present invention more comprehensible, embodiments accompanied with figures are described in detail below.

DETAILED DESCRIPTION

Figure 1:
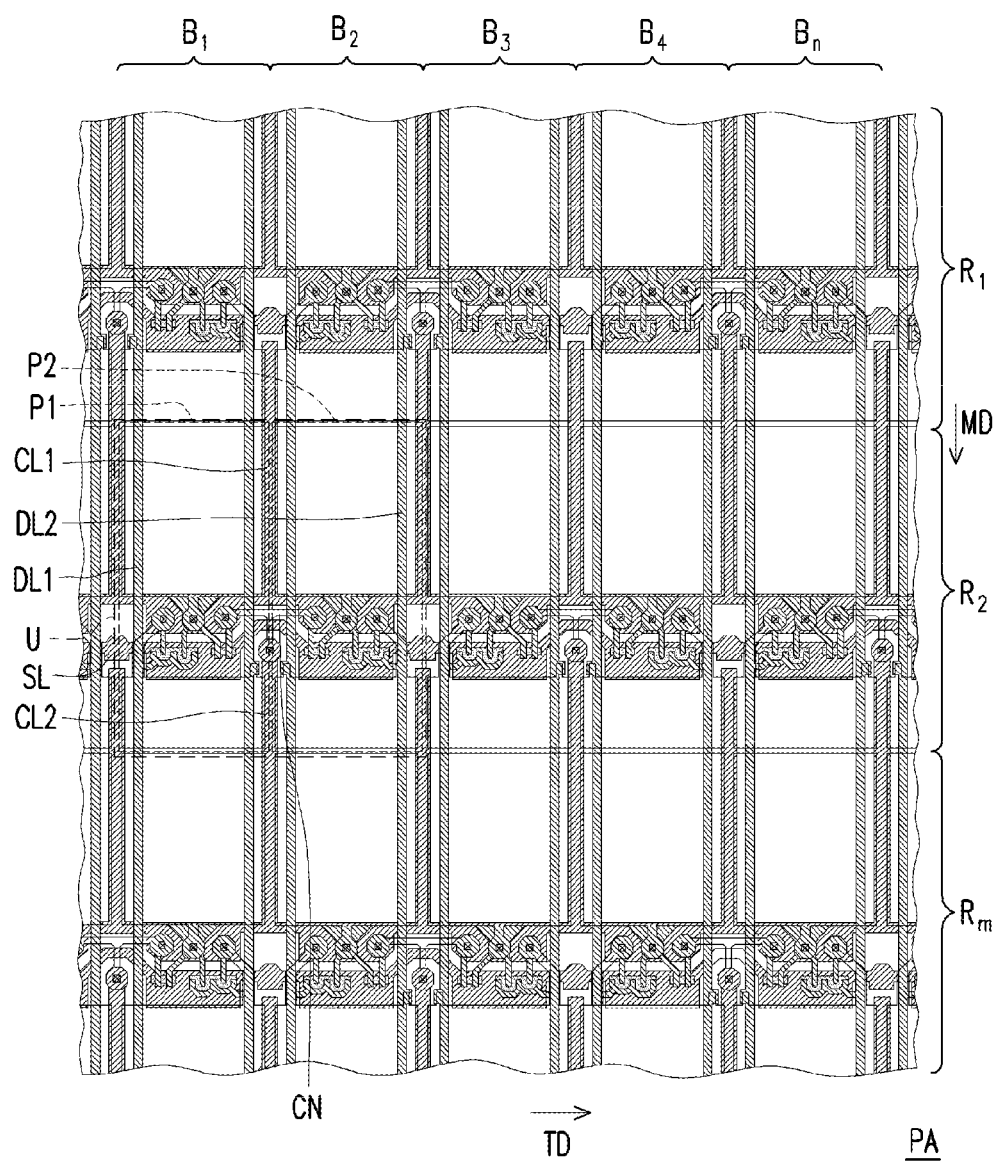
FIG. 1 is a schematic top view of a pixel array according to an embodiment of the present invention.

FIG. 1 is a schematic top view of a pixel array PA according to an embodiment of the present invention. Referring to FIG. 1, the pixel array PA includes multiple pixel units U which are repeatedly arranged. A pixel unit U includes a scan line SL, a first data line DL1, a second data line DL2, a first pixel structure P1, a second pixel structure P2, a first common electrode line CL1, a second common electrode line CL2, and a common connecting portion CN.

In this embodiment, the first pixel structures P1 and the second pixel structures P2 are arranged in a first direction TD in an interlaced manner, so as to define multiple columns $B_1$ to $B_n$. According to another aspect, the first pixel structures P1 and the second pixel structures P2 are arranged in a second direction MD, which is different from the first direction TD, in an interlaced manner, so as to define multiple rows $R_1$ to $R_m$. Specifically, in an Mth row, the first pixel structure P1 is located at an Nth column, and the second pixel structure P2 is located at an (N+1)th column. According to another aspect, in an (M+1)th row, the first pixel structure P1 is located at the (N+1)th column, and the second pixel structure P2 is located at the Nth column. For example, assuming that N=1 and M=2, and therefore, in a second row, the first pixel structure P1 is located at a first column, and the second pixel structure P2 is located at a second column. According to another aspect, in a third row, the first pixel structure P1 is located at the second column, and the second pixel structure P2 is located at the first column. In other words, in this embodiment, the first pixel structures P1 are arranged in shapes of checkerboard squares, and the second pixel structures P2 are also arranged in shapes of checkerboard squares, as shown in FIG. 1. According to another aspect, in the Mth row, the common connecting portion CN is located between the Nth column and the (N+1)th column, and in the (M+1)th row, the common connecting portion CN is located between the (N+1)th column and an (N+2)th column. For example, in a second row, the common connecting portion CN is located between a first column and a second column, and in a third row, the common connecting portion CN is located between the second column and a third column.

Figure 2:
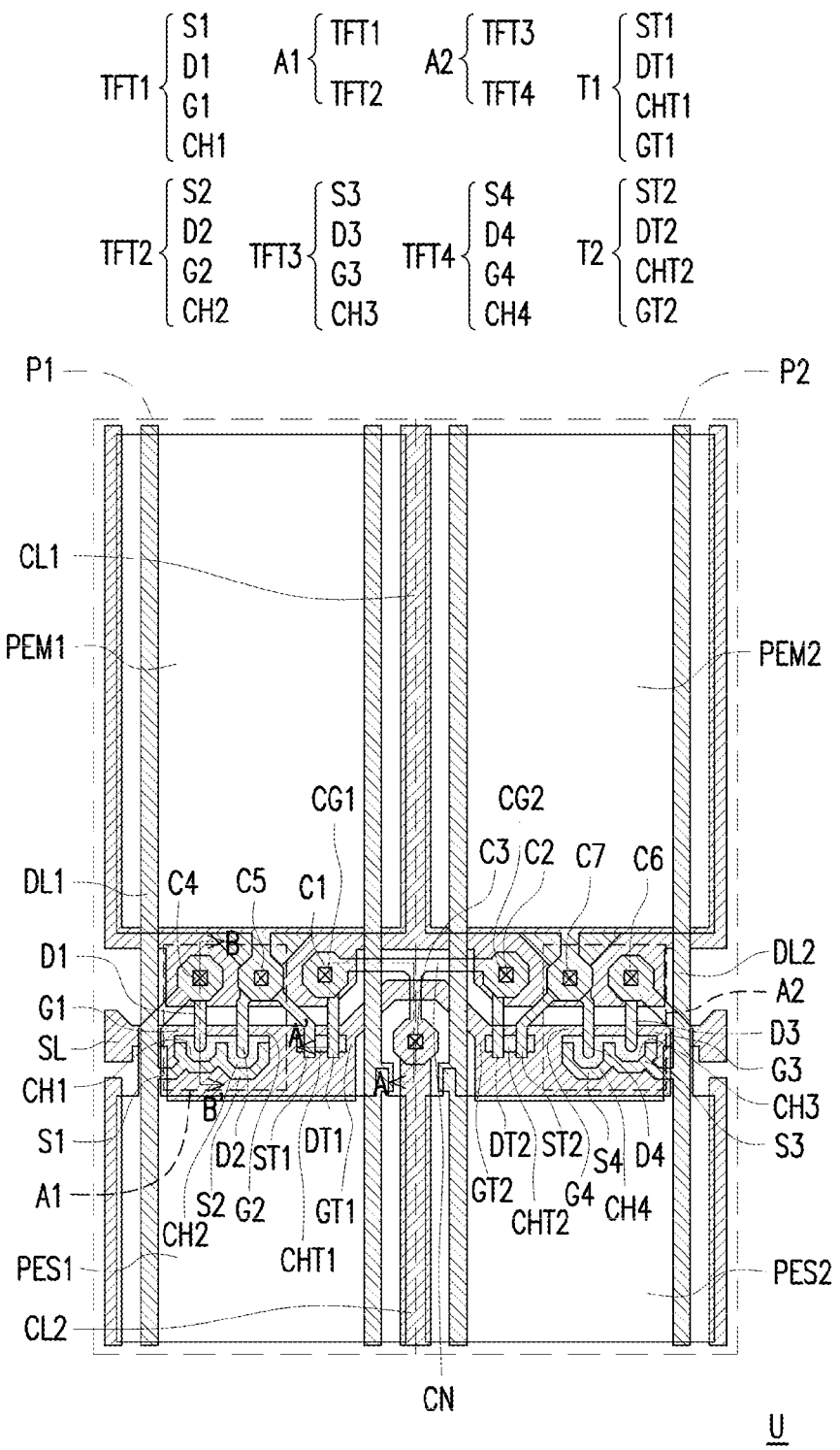
FIG. 2 is a schematic top view of pixel units in the pixel array according to FIG. 1.

FIG. 2 is a schematic top view of pixel units U in the pixel array PA according to FIG. 1. Referring to FIG. 2, as described earlier, a pixel unit U includes a scan line SL, a first data line DL1, a second data line DL2, a first pixel structure P1, a second pixel structure P2, a first common electrode line CL1, a second common electrode line CL2, and a common connecting portion CN. The first pixel structure P1 includes a first switching element A1, a first main pixel electrode PEM1, a first sub pixel electrode PES1, and a first active element T1. According to another aspect, the second pixel structure P2 includes a second switching element A2, a second main pixel electrode PEM2, a second sub pixel electrode PES2, and a second active element T2.

Figure 3:
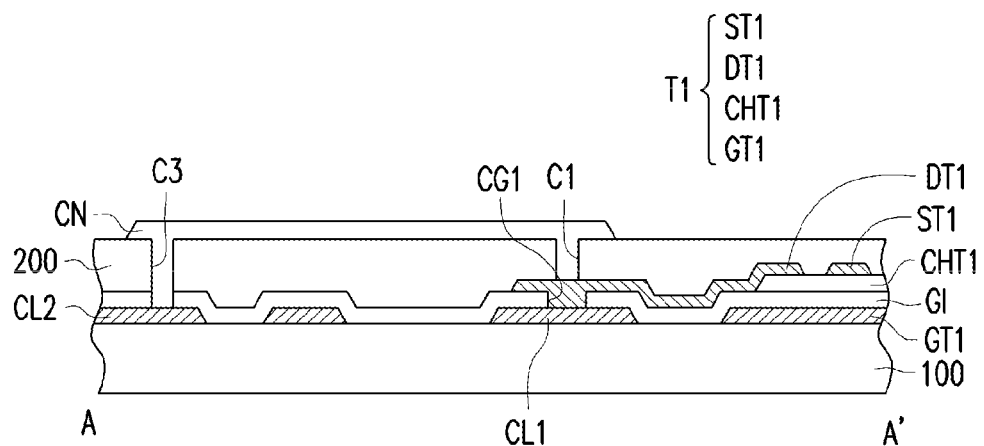
FIG. 3 is a schematic sectional diagram of a section line A-A' according to FIG. 2.
Figure 4:
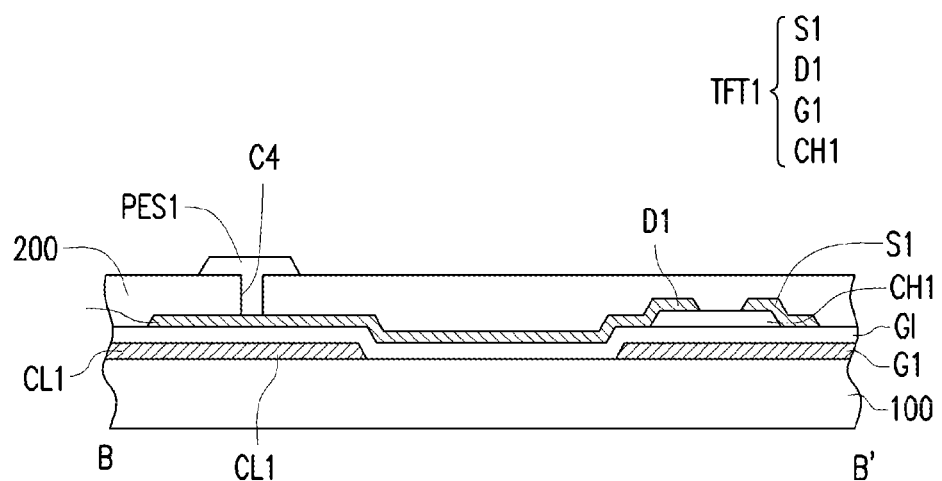
FIG. 4 is a schematic sectional diagram of a section line B-B' according to FIG. 2.

FIG. 3 is a schematic sectional diagram of a section line A-A' according to FIG. 2. FIG. 4 is a schematic sectional diagram of a section line B-B' according to FIG. 2. Referring to FIG. 2 to FIG. 4, a manner for forming a pixel unit U is described in detail below.

First, a first metal material layer (not shown) is formed on a substrate 100, and the first metal material layer is patterned to form a scan line SL, multiple gates G1 to G4, a first active gate GT1, a second active gate GT2, a first common electrode line CL1, and a second common electrode line CL2. In other words, the scan line SL, the gates G1 to G4, the first active gate GT1, the second active gate GT2, the first common electrode line CL1, and the second common electrode line CL2 are in a same film layer. The material of the substrate may be glass, quartz, organic polymers, metals, and the like. According to another aspect, the first metal material layer uses a metal material, but the present invention is not limited thereto. According to other embodiments, other conductive materials may be also used, for example, alloys, nitrides of metal materials, oxides of metal materials, nitrogen oxides of metal materials, or a stacked layer of metal materials and other conductive materials. It shall be noted that the first common electrode line CL1 and the second common electrode line CL2 are separated at a position where the scan line passes, so as to form different common electrode lines. According to another aspect, the first common electrode line CL1 and the second common electrode line CL2 are electrically connected to a common voltage (Vcom).

Second, a gate insulation layer GI is formed on the scan line SL, the gates G1 to G4, the first active gate GT1, the second active gate GT2, the first common electrode line CL1, and the second common electrode line CL2. The material of the gate insulation layer GI includes inorganic materials (for example, silicon oxide, silicon nitride, silicon oxynitride, other appropriate materials, or a stacked layer of at least two of the foregoing materials), organic materials, other appropriate materials, or combinations of the foregoing materials. Third, channel layers CH1 to CH4, a first active channel layer CHT1, and a second active channel layer CHT2 are formed on the gate insulation layer GI. The materials of the channel layers CH1 to CH4, the first active channel layer CHT1, and the second active channel layer CHT2 may select amorphous silicon, polysilicon, or oxide semiconductor materials, but the present invention does not limit thereto.

Fourth, a second metal material layer (not shown) is formed on the gate insulation layer GI, the channel layers CH1 to CH4, the first active channel layer CHT1, and the second active channel layer CHT2, and the second metal material layer is patterned to form a first data line DL1, a second data line DL2, multiple sources S1 to S4, multiple drains D1 to D4, a first active source ST1, a second active source ST2, a first active drain DT1, and a second drain DT2. In this embodiment, the first data line DL1, the second data line DL2, the sources S1 to S4, the drains D1 to D4, the first active source ST1, the second active source ST2, the first active drain DT1, and the second drain DT2 are in a same film layer. The scan line SL is arranged to be interlaced with the first data line DL1 and the second DL2. In other words, an extension direction of the scan line SL is not parallel with extension directions of the first data line DL1 and the second data line DL2, and preferably, the extension direction of the scan line SL is perpendicular to the extension directions of the first data line DL1 and the second data line DL2. The material of the second metal material layer may be the same as or be different from the material of the first metal material layer. In other words, the material of the first data line DL1 and the second data line DL2 may be the same as or be different from the material of the scan line SL. Specifically, the first data line DL1 and the second data line DL2 usually use metal materials, but the present invention does not limit thereto. According to other embodiments, the first data line DL1 and the second data line DL2 may also use other conductive materials, for example, alloys, nitrides of metal materials, oxides of metal materials, nitrogen oxides of metal materials, a stacked layer of metal materials and other conductive materials, or other appropriate materials.

The gates G1 to G4, the sources S1 to S4, the drains D1 to D4, and the channel layers CH1 to CH4 form a first thin film transistor (TFT) to a fourth TFT, TFT1 to TFT4, respectively. Specifically, in this embodiment, the first TFT gate G1, the first TFT source S1, the first TFT drain D1, and the first TFT channel layer CH1 together form the first TFT TFT1; the second TFT gate G2, the second TFT source S2, the second TFT drain D2, and the second TFT channel layer CH2 form the second TFT TFT2; the third TFT gate G3, the third TFT source S3, the third TFT drain D3, and the third TFT channel layer CH3 form the third TFT TFT3; and the fourth TFT gate G4, the fourth TFT source S4, the fourth TFT drain D4, and the fourth TFT channel layer CH4 form the fourth TFT TFT4. The first TFT TFT1 and the second TFT TFT2 form a first switching element A1, and the third TFT TFT3 and the fourth TFT TFT4 form a second switching element A2. According to another aspect, the first active gate GT1, the first active source ST1, the first active drain DT1, and the first active channel layer CHT1 form a first active element T1, and the second active gate GT2, the second active source ST2, the second active drain DT2, and the second active channel layer CHT2 form a second active element T2.

According to another aspect, the gate insulation layer GI further includes a first gate insulation layer contact window CG1 and a second gate insulation layer contact window CG2, so as to enable the first active drain DT1 of the first active element T1 and the second active drain DT2 of the second active element T2 to be electrically connected to the first common electrode line CL1 separately, as shown in FIG. 3. Specifically, in this embodiment, the first active drain DT1 of the first active element T1 is electrically connected to the first common electrode line CL1 through the first gate insulation layer contact window CG1, and the second active drain DT2 of the second active element T2 is electrically connected to the first common electrode line CL1 through the second gate insulation layer contact window CG2.

Referring to FIG. 2, the first TFT gate G1 of the first TFT TFT1 is electrically connected to the scan line SL, and the first TFT source S1 of the first TFT TFT1 is electrically connected to the first data line DL1. According to another aspect, the first TFT gate G2 of the second TFT TFT2 is electrically connected to the scan line SL, and the second TFT source S2 of the second TFT TFT2 is electrically connected to the first TFT source S1 of the first TFT TFT1. Similarly, the third TFT gate G3 of the third TFT TFT3 is electrically connected to the scan line SL, and the third TFT source S3 of the third TFT TFT3 is electrically connected to the second data line DL2. According to another aspect, the fourth TFT gate G4 of the fourth TFT TFT4 is electrically connected to the scan line SL, and the fourth TFT source S4 of the fourth TFT TFT4 is electrically connected to the third TFT source S3 of the third TFT TFT3. The first active gate GT1 of the first active element T1 is electrically connected to the scan line SL, and the first active source ST1 of the first active element T1 is electrically connected to the second TFT drain D2 of the second TFT TFT2. In other words, the first active element T1 is electrically connected to the first switching element A1 Similarly, the second active gate GT2 of the second active element T2 is electrically connected to the scan line SL, and the second active source ST2 of the second active element T2 is electrically connected to the fourth TFT drain D4 of the fourth TFT TFT4. In other words, the second active element T2 is electrically connected to the second switching element A2.

Fifth, an insulation layer 200 is formed on the first data line DL1, the second data line DL2, the sources S1 to S4, the drains D1 to D4, the first active source ST1, the second active source ST2, the first active drain DT1, and the second active drain DT2, as shown in FIG. 3 and FIG. 4. The material of the insulation layer 200 may be the same as or be different from the material of the gate insulation layer GI. For example, the material of the insulation layer 200 includes inorganic materials (for example, silicon oxide, silicon nitride, silicon oxynitride, other appropriate materials, or a stacked layer of at least two of the foregoing materials), organic materials, other appropriate materials, or combinations of the foregoing materials.

Sixth, a first main pixel electrode PEM1, a first sub pixel electrode PES1, a second main pixel electrode PEM2, a second sub pixel electrode PES2, and a common connecting portion CN are formed on the insulation layer 200. In other words, the first main pixel electrode PEM1, the first sub pixel electrode PES1, the second main pixel electrode PEM2, the second sub pixel electrode PES2, and the common connecting portion CN are in a same film layer. The first main pixel electrode PEM1, the first sub pixel electrode PES1, the second main pixel electrode PEM2, the second sub pixel electrode PES2, and the common connecting portion CN may be transmissive pixel electrodes, reflective pixel electrodes, or semi-transmissive and semi-reflective pixel electrodes. The material of the transmissive pixel electrode includes metal oxides, for example, indium tin oxide, indium zinc oxide, aluminum tin oxide, aluminum zinc oxide, indium germanium zinc oxide, other appropriate oxides, or a stacked layer of at least two of the foregoing oxides. The material of the reflective pixel electrode includes a metal material having high reflectivity.

Referring to FIG. 2, the first main pixel electrode PEM1 and the first sub pixel electrode PES1 are separately disposed at two sides of the scan line SL, and the second main pixel electrode PEM2 and the second sub pixel electrode PES2 are also separately disposed at the two sides of the scan line SL. According to another aspect, the first common electrode line CL1 is disposed between the first main pixel electrode PEM1 and the second main pixel electrode PEM2, and the second common electrode line CL2 is disposed between the first sub pixel electrode PES1 and the second sub pixel electrode PES2. The first main pixel electrode PEM1 and the second main pixel electrode PEM2 may be partially overlapped with the first common electrode line CL1, and the first sub pixel electrode PES1 and the second sub pixel electrode PES2 may be partially overlapped with the second common electrode line CL2, but it is not limited thereto. In other embodiments, pixel electrodes PES1, PES2, PEM1, and PEM2 may be also not overlapped with common electrode lines CL1 and CL2.

Referring to FIG. 2 and FIG. 4, in this embodiment, the common connecting portion CN is in a shape of a T, that is, the common connecting portion CN has three end points, where a first end point of the common connecting portion CN is electrically connected to the first active drain DT1 of the first active element T1 by using a first contact window C1 that penetrates through the insulation layer 200, a second end point is electrically connected to the second active drain DT2 of the second active element T2 by using a second contact window C2 that penetrates through the insulation layer 200, and a third end point is electrically connected to the second common electrode line CL2 by using a third contact window C3 that penetrates through the insulation layer 200 and the gate insulation layer GI. Further, the first active drain DT1 of the first active element T1 is electrically connected to the first common electrode line CL1 through the first gate insulation layer contact window CG1, and therefore, the second common electrode line CL2 can be electrically connected to the first common electrode line CL1 sequentially through the third contact window C3, the common connecting portion CN, the first contact window C1, the first active drain DT1, and the first gate insulation layer contact window CG1. Similarly, the second active drain DT2 of the second active element T2 is electrically connected to the first common electrode line CL1 through the second gate insulation layer contact window CG2, and therefore, the second common electrode line CL2 can be electrically connected to the first common electrode line CL1 sequentially through the third contact window C3, the common connecting portion CN, the second contact window C2, the second active drain DT2, and the second gate insulation layer contact window CG2. In other words, the common connecting portion CN electrically connects the first common electrode line CL1 and the second common electrode line CL2.

According to another aspect, the first sub pixel electrode PES1 is electrically connected to the first TFT drain D1 of the first TFT TFT1 by using a fourth contact window C4 that penetrates through the insulation layer 200, and the first main pixel electrode PEM1 is electrically connected to the second TFT drain D2 of the second TFT TFT2 by using a fifth contact window C5 that penetrates through the insulation layer 200. Similarly, the second sub pixel electrode PES2 is electrically connected to the third TFT drain D3 of the third TFT TFT3 by using a sixth contact window C6 that penetrates through the insulation layer 200, and the second main pixel electrode PEM2 is electrically connected to the fourth TFT drain D4 of the fourth TFT TFT4 by using a seventh contact window C7 that penetrates through the insulation layer 200. In other words, the first main pixel electrode PEM1 and the first sub pixel electrode PES1 are electrically connected to the first switching element A1, and the second main pixel electrode PEM2 and the second sub pixel electrode PES2 are electrically connected to the second switching element A2. As described earlier, the first active source ST1 of the first active element T1 is electrically connected to the second TFT drain D2 of the second TFT TFT2, and therefore, the first active source ST1 of the first active element T1 is also electrically connected to the first main pixel electrode PEM1. According to another aspect, the second active source ST2 of the second active element T2 is electrically connected to the fourth TFT drain D4 of the fourth TFT TFT4, and therefore, the second active source ST2 of the second active element T2 is also electrically connected to the second main pixel electrode PEM2.

Figure 5:
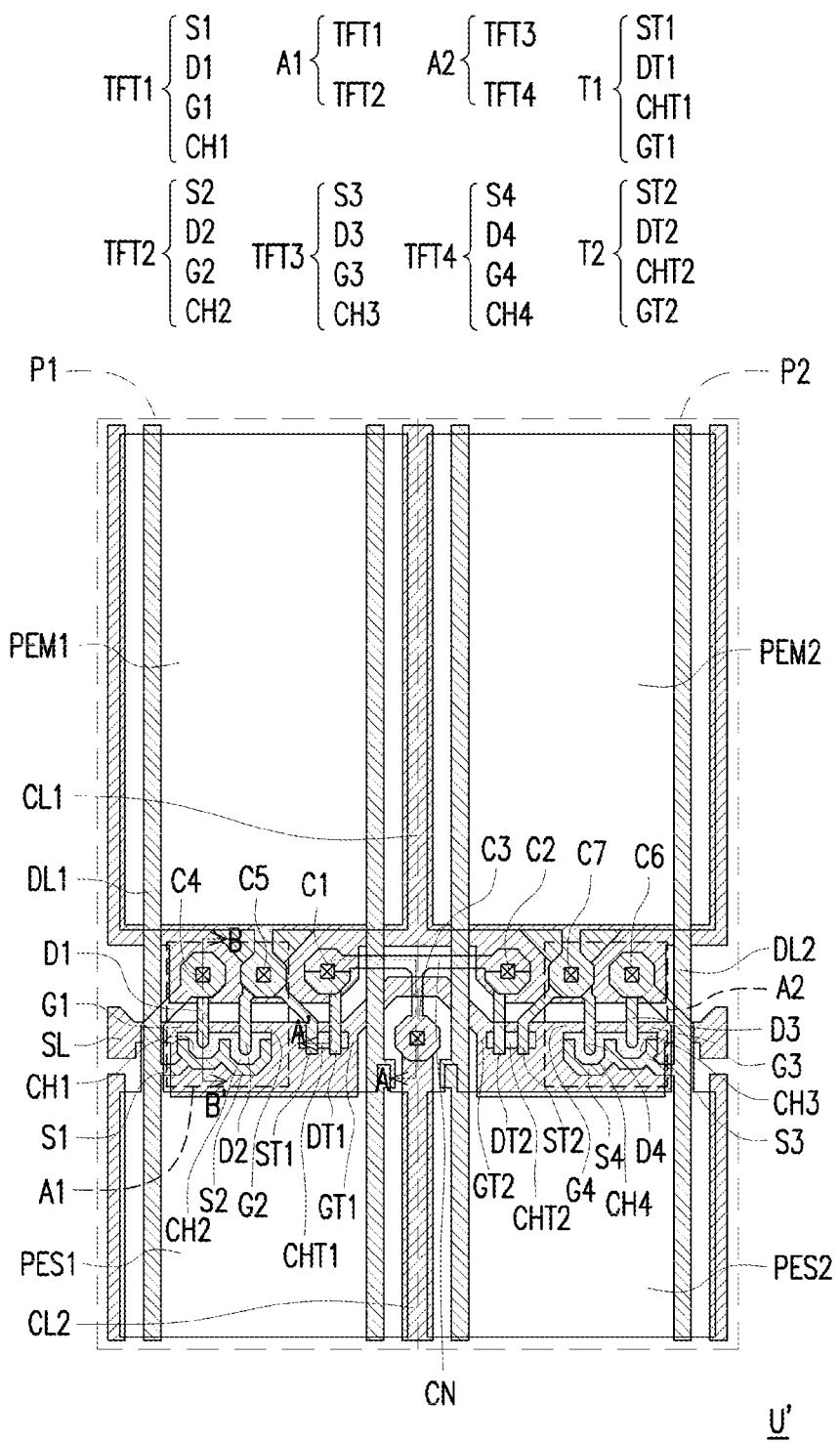
FIG. 5 is a schematic top view of pixel units in a pixel array according to another embodiment of the present invention.
Figure 6:
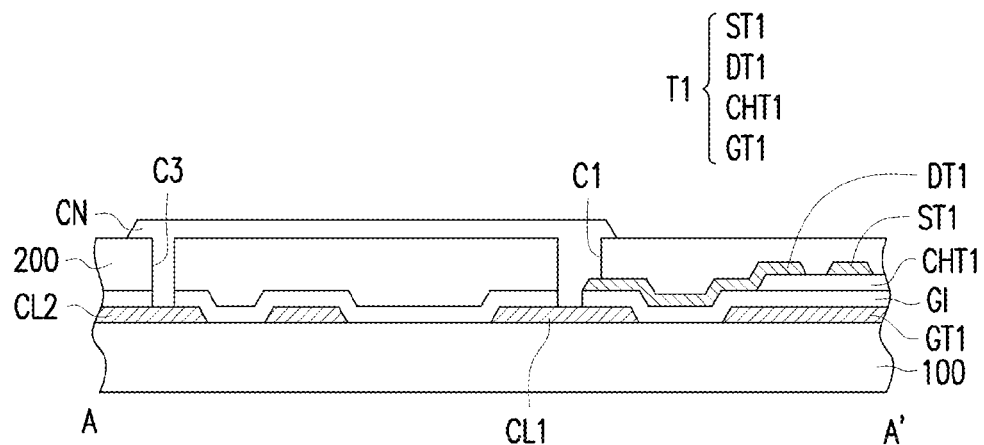
FIG. 6 is a schematic sectional diagram of a section line A-A' according to FIG. 5.
Figure 7:
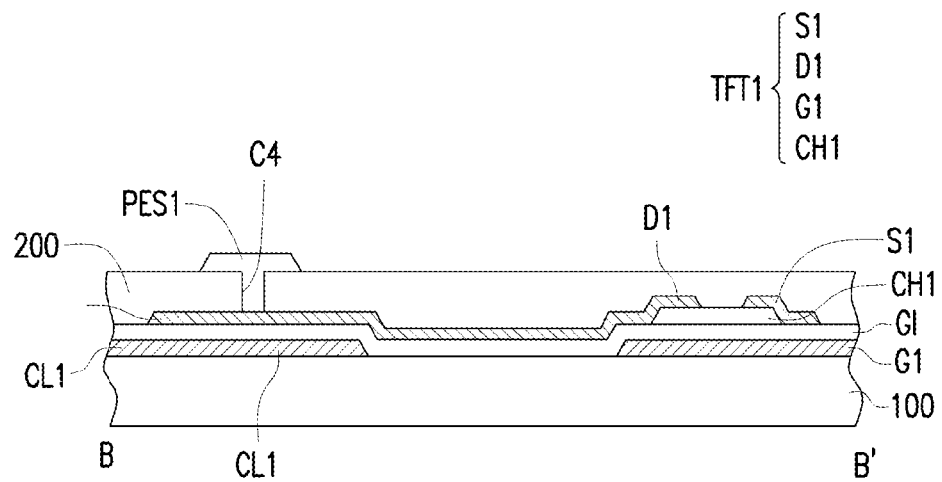
FIG. 7 is a schematic sectional diagram of a section line B-B' according to FIG. 5.

FIG. 5 is a schematic top view of pixel units U in a pixel array according to another embodiment of the present invention. FIG. 6 is a schematic sectional diagram of a section line A-A' according to FIG. 5. FIG. 7 is a schematic sectional diagram of a section line B-B' according to FIG. 5. Referring to FIG. 5 to FIG. 7, this embodiment is similar to the embodiment of FIG. 2 to FIG. 4, and therefore, similar content is not described herein again. This embodiment differs from the embodiment of FIG. 2 to FIG. 4 in that: in this embodiment, a first contact window C1 and a second contact window C2 directly penetrate through a gate insulation layer GI and an insulation layer 200, and an edge of a first active drain DT1 of a first active element T1 and an edge of a second active drain DT2 of a second active element T2 are located in the first contact window C1 and the second contact window C2 respectively. In other words, in this embodiment, a common connecting portion CN is electrically connected to the first active drain DT1 of the first active element T1 and a first common electrode line CL1 simultaneously by directly using the first contact window C1. Similarly, in this embodiment, the common connecting portion CN is electrically connected to the second active drain DT2 of the second active element T2 and the first common electrode line CL1 simultaneously by directly using the second contact window C2. Therefore, in this embodiment, a second common electrode line CL2 can be electrically connected to the first common electrode line CL1 sequentially through the third contact window C3, the common connecting portion CN, and the first contact window C1, and the second common electrode line CL2 can be electrically connected to the first common electrode line CL1 sequentially through the third contact window C3, the common connecting portion CN, and the second contact window C2.

To sum up, the pixel structure and the pixel array of the present invention increases an aperture ratio by means of a connecting portion. On the other hand, the design of the pixel structure and the pixel array of the present invention can enable a bridge electrode and a pixel electrode to be spaced with a relatively large distance, and therefore, occurrence of a short circuit problem between the bridge electrode and the pixel electrode can be avoided. By using the design of the pixel structure and the pixel array of the present invention, a disconnection of a connecting portion may be also avoided, so as to improve a yield of displays.

The present invention has been disclosed above through embodiments. However, the embodiments are not intended to limit the present disclosure. A person of ordinary skill in the art can make various modifications and improvements without departing from the spirit and scope of the present disclosure. Therefore, the protection scope of the present disclosure should be subject to the scope defined by the claims.

What is claimed is:

1. A pixel unit, comprising:
   a scan line;
   a first data line and a second data line;
   a first pixel structure, comprising:
      a first switching element;
      a first main pixel electrode and a first sub pixel electrode, wherein the first main pixel electrode and the first sub pixel electrode are separately disposed at two sides of the scan line and are electrically connected to the first switching element; and
      a first active element, wherein the first active element is electrically connected to the first switching element;
   a second pixel structure, comprising:
      a second switching element;
      a second main pixel electrode and a second sub pixel electrode, wherein the second main pixel electrode and the second sub pixel electrode are separately disposed at two sides of the scan line and are electrically connected to the second switching element; and
      a second active element, wherein the second active element is electrically connected to the second switching element;
   a first common electrode line, disposed between the first main pixel electrode and the second main pixel electrode;
   a second common electrode line, disposed between the first sub pixel electrode and the second sub pixel electrode, wherein the first common electrode line and the second common electrode line are separated at a position where the scan line passes; and
   a common connecting portion, electrically connecting the first common electrode line and the second common electrode line.

2. The pixel unit according to claim 1, wherein the first switching element comprises:
   a first thin film transistor (TFT), comprising: a gate, a source, and a drain, wherein the gate of the first TFT is electrically connected to the scan line, the source of the first TFT is electrically connected to the first data line, and the drain of the first TFT is electrically connected to the first sub pixel electrode; and
   a second TFT, comprising: a gate, a source, and a drain, wherein the gate of the second TFT is electrically connected to the scan line, the source of the second TFT is electrically connected to the source of the first TFT, and the drain of the second TFT is electrically connected to the first main pixel electrode.

3. The pixel unit according to claim 2, wherein the second switching element comprises:
   a third TFT, comprising: a gate, a source, and a drain, wherein the gate of the third TFT is electrically connected to the scan line, the source of the third TFT is electrically connected to the second data line, and the drain of the third TFT is electrically connected to the second sub pixel electrode; and
   a fourth TFT, comprising: a gate, a source, and a drain, wherein the gate of the fourth TFT is electrically connected to the scan line, the source of the fourth TFT is electrically connected to the source of the third TFT, and the drain of the fourth TFT is electrically connected to the second main pixel electrode.

4. The pixel unit according to claim 3, wherein the first active element comprises a first gate, a first source, and a first drain; the first gate is electrically connected to the scan line; the first source is electrically connected to the drain of the second TFT and the first main pixel electrode; and the second common electrode line is electrically connected to the first drain and the first common electrode line by using the common connecting portion; and the second active element comprises a second gate, a second source, and a second drain; the second gate is electrically connected to the scan line; the second source is electrically connected to the drain of the fourth TFT and the second main pixel electrode; and the second common electrode line is electrically connected to the second drain and the first common electrode line by using the common connecting portion.

5. The pixel unit according to claim 4, further comprising: a first contact window, a second contact window, and a third contact window, wherein the first drain of the first active element is electrically connected to the second common electrode line by using the first contact window and the third contact window, and the second drain of the second active element is electrically connected to the second common electrode line by using the second contact window and the third contact window.

6. The pixel unit according to claim 5, further comprising: a first gate insulation layer contact window and a second gate insulation layer contact window, wherein the first drain of the first active element is electrically connected to the first common electrode line by using the first gate insulation layer contact window, and the second drain of the second active element is electrically connected to the first common electrode line by using the second gate insulation layer contact window.

7. The pixel unit according to claim 5, wherein the first common electrode line is electrically connected to the second common electrode line by using the first contact window and the third contact window, and the first common electrode line is electrically connected to the second common electrode line by using the second contact window and the third contact window.

8. The pixel unit according to claim 7, wherein an edge of the first drain of the first active element is located in the first contact window and exposes the first common electrode line, and the common connecting portion is electrically connected to the first drain of the first active element and the first common electrode line by using the first contact window.

9. The pixel unit according to claim 1, wherein the common connecting portion, the first main pixel electrode, the first sub pixel electrode, the second main pixel electrode, and the second sub pixel electrode are in a same film layer.

10. The pixel unit according to claim 1, wherein the first common electrode line and the second common electrode line are electrically connected to a common voltage (Vcom).

11. The pixel unit according to claim 1, wherein the first main pixel electrode and the second main pixel electrode are partially overlapped with the first common electrode line, and the first sub pixel electrode and the second sub pixel electrode are partially overlapped with the second common electrode line.

12. A pixel array, comprising multiple pixel units according to claim 1, wherein the pixel units are arranged repeatedly to form an array; the first pixel structures and the second pixel structures of the pixel units are arranged in a first direction in an interlaced manner to define multiple columns; the first pixel structures and the second pixel structures are arranged in a second direction in an interlaced manner to define multiple rows; and the first direction is different from the second direction.

13. The pixel array according to claim 12, wherein in an Mth row, the first pixel structure is located at an Nth column, and the second pixel structure is located at an (N+1)th column; and in an (M+1)th row, the first pixel structure is located at the (N+1)th column, and the second pixel structure is located at the Nth column.

14. The pixel array according to claim 12, wherein in an Mth row, the common connecting portion is located between an Nth column and an (N+1)th column, and in an (M+1)th row, the common connecting portion is located between the (N+1)th column and an (N+2)th column.

* * * * *